United States Patent
Curchod et al.

(10) Patent No.: US 11,467,540 B2
(45) Date of Patent: Oct. 11, 2022

(54) EXTERNAL ELEMENT MADE OF ZIRCONIA WITH SELECTIVELY CONDUCTIVE ZONES FOR ELECTRONIC APPLICATIONS

(71) Applicant: The Swatch Group Research and Development Ltd, Marin (CH)

(72) Inventors: Loic Curchod, Lausanne (CH); Simon Springer, Bern (CH)

(73) Assignee: The Swatch Group Research and Development Ltd, Marin (CH)

( * ) Notice: Subject to any disclaimer, the term of this patent is extended or adjusted under 35 U.S.C. 154(b) by 825 days.

(21) Appl. No.: 16/062,895

(22) PCT Filed: Dec. 5, 2016

(86) PCT No.: PCT/EP2016/079714
§ 371 (c)(1),
(2) Date: Jun. 15, 2018

(87) PCT Pub. No.: WO2017/102399
PCT Pub. Date: Jun. 22, 2017

(65) Prior Publication Data
US 2019/0004481 A1    Jan. 3, 2019

(30) Foreign Application Priority Data

Dec. 18, 2015 (EP) .................................... 15201257

(51) Int. Cl.
*G04B 37/22* (2006.01)
*C04B 41/87* (2006.01)
(Continued)

(52) U.S. Cl.
CPC ............ *G04B 37/22* (2013.01); *C04B 41/009* (2013.01); *C04B 41/87* (2013.01); *C23C 18/00* (2013.01);
(Continued)

(58) Field of Classification Search
CPC ............ C04B 41/4558; C04B 41/4572; C04B 41/5057; C04B 41/5062; C04B 41/90;
(Continued)

(56) References Cited

U.S. PATENT DOCUMENTS 5,641,545 A    6/1997 Sandhu
5,800,617 A    9/1998 Sandhu
(Continued)

FOREIGN PATENT DOCUMENTS

DE    24 46 431 A1    4/1976
EP    0 287 746 A1    10/1988
(Continued)

OTHER PUBLICATIONS

International Search Report dated Jan. 5, 2018 in PCT/EP2016/079714 (with English translation), citing documents AA, AB, and AO through AU therein, 10 pages.

*Primary Examiner* — Alex B Efta
(74) *Attorney, Agent, or Firm* — Oblon, McClelland, Maier & Neustadt, L.L.P.

(57) ABSTRACT

An external element made from a first material for a wearable object, the first material being an insulating ceramic, wherein a surface of the external element is at least partially treated to include at least one conversion with an electrical conductivity.

12 Claims, 4 Drawing Sheets

(51) Int. Cl.
   *C04B 41/45*   (2006.01)
   *C04B 41/50*   (2006.01)
   *C23C 18/00*   (2006.01)
   *C04B 41/00*   (2006.01)
   *C04B 41/53*   (2006.01)
   *C01G 25/00*   (2006.01)
   *C23C 14/22*   (2006.01)

(52) U.S. Cl.
   CPC .......... *C01G 25/00* (2013.01); *C01P 2006/40* (2013.01); *C04B 41/45* (2013.01); *C04B 41/456* (2013.01); *C04B 41/4558* (2013.01); *C04B 41/4572* (2013.01); *C04B 41/5057* (2013.01); *C04B 41/5062* (2013.01); *C04B 41/53* (2013.01); *C23C 14/22* (2013.01); *G04B 37/225* (2013.01)

(58) Field of Classification Search
   CPC ....... C04B 41/52; B44C 1/26; G04B 45/0076; G04G 17/04; G04G 17/06; G04G 21/04
   See application file for complete search history.

(56) References Cited

U.S. PATENT DOCUMENTS

| | | | | |
|---|---|---|---|---|
| 5,928,977 | A | * | 7/1999 | Magnin .................. C04B 41/87 501/87 |
| 2005/0136284 | A1 | * | 6/2005 | Grippo ................. C04B 41/009 428/688 |
| 2007/0228007 | A1 | * | 10/2007 | Besson ................. C04B 41/009 216/65 |
| 2011/0259753 | A1 | * | 10/2011 | Grossenbacher ...... C25D 5/627 205/162 |
| 2012/0252373 | A1 | * | 10/2012 | Saito ...................... G04R 60/10 455/73 |
| 2014/0112112 | A1 | * | 4/2014 | Plankert ................. C04B 41/52 368/276 |
| 2014/0278220 | A1 | * | 9/2014 | Yuen .................... A61B 5/02427 702/150 |
| 2015/0092524 | A1 | | 4/2015 | Verdon |
| 2015/0122774 | A1 | | 5/2015 | Fernandez Ciurleo |

FOREIGN PATENT DOCUMENTS

| | | |
|---|---|---|
| EP | 0 850 900 A1 | 7/1998 |
| EP | 0 850 900 B1 | 7/1998 |
| EP | 1 548 524 A1 | 6/2005 |
| EP | 2 725 000 A1 | 4/2014 |
| EP | 2 856 903 A1 | 4/2015 |
| GB | 1 488 696 A | 10/1977 |

* cited by examiner

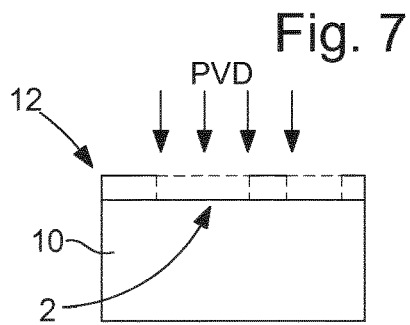
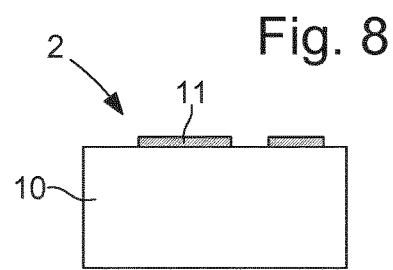
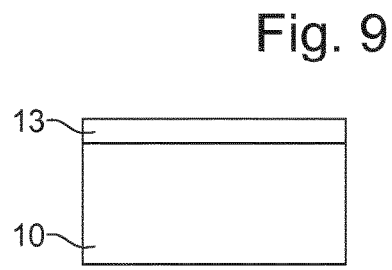
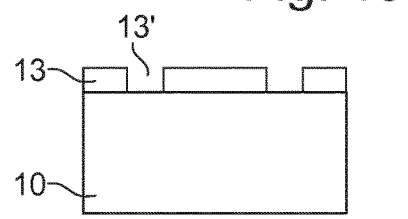
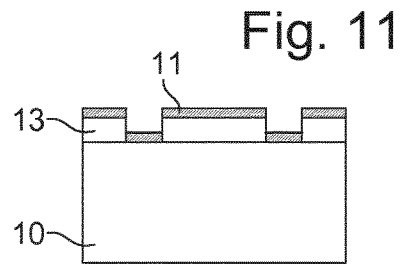
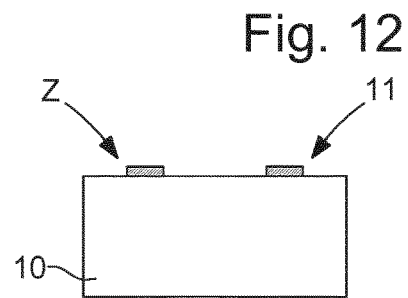
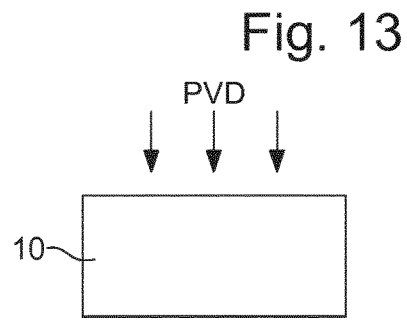
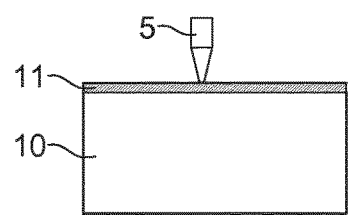
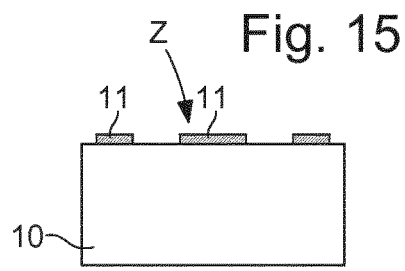

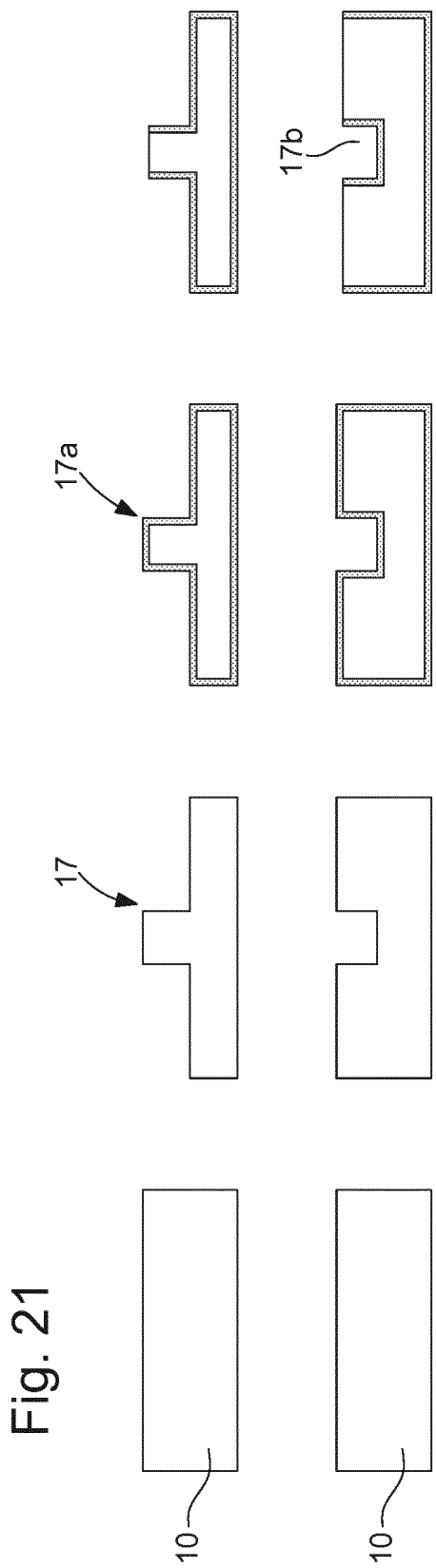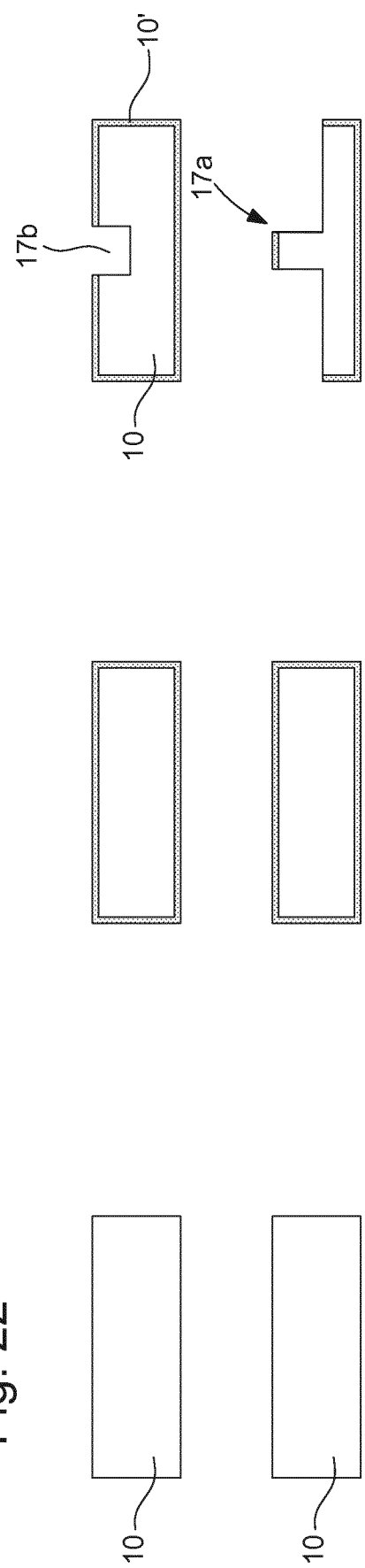

EXTERNAL ELEMENT MADE OF ZIRCONIA WITH SELECTIVELY CONDUCTIVE ZONES FOR ELECTRONIC APPLICATIONS

CROSS-REFERENCE TO RELATED APPLICATIONS

This is a National phase Application in the United States of International Patent Application PCT/EP2016/079714 filed on Dec. 5, 2016 which claims priority from European patent application No. 15201257.1 of Dec. 18, 2015. The entire disclosure of the above patent applications are hereby incorporated by reference.

The present invention relates to an external element and to its manufacturing process, said element being made from a ceramic, namely zirconia, the conductivity of which is selectively modified.

PRIOR ART

Wearable objects such as watches or bracelets that are partially made of ceramic are known. One known ceramic is zirconia $ZrO_2$.

Moreover, the current trend with wearable objects is for them to increasingly integrate connectivity and electronic functionalities.

This increase in the technology incorporated into watches takes the form of the integration of touch control means offering a more intuitive and user-friendly interaction or takes the form of the integration of wireless communication functions, the watch then being able to communicate with another device such as a smart phone.

However, this increase in electronic functionalities is problematic because it involves an increasing number of components and places additional constraints on external parts. With regard to communication, an antenna is required, involving an antenna holder and a connector for connecting the antenna to the main electronic module. The zone in which the antenna is located must be free of electrically conductive parts in order to afford the best possible transmission properties.

Likewise, in the case of touch controls, electrodes are necessary, and therefore means allowing these electrodes to be supported and means for connecting these electrodes to the main electronic module are also necessary.

It may thus be stated that the integration of new technologies is tending to increase constraints and the number of components, this implying miniaturization and adaptation thereof and therefore an increase in cost or an increase in the size of the case of the watch or an aesthetic change.

There is therefore a need to find a solution to this increase in electronic functionalities in a watch.

SUMMARY OF THE INVENTION

The aim of the present invention is to mitigate the drawbacks of the prior art by providing an external element made of ceramic and the manufacturing process thereof that allow the selective production of conductive zones in order to allow integration of functionalities.

To this end, the invention relates to an external element for a wearable object made from a first material, the first material being an insulating ceramic, characterized in that the surface of said external element is at least partially treated so as to have at least one conversion with a non-zero electrical conductivity.

This invention allows an external element that has insulating zones and zones having an electrical conductivity to be obtained such that it is possible to use these zones for applications such as conductive tracks, antennas, electronic circuits or electrodes for touch controls.

In a first embodiment, the first material is zirconia.

In a second embodiment, the surface is selectively treated in order to be converted into zirconium carbide, the conductivity of which is non-zero.

In a third embodiment, the surface is selectively treated in order to be converted into zirconium nitride, the conductivity of which is non-zero.

In a fourth embodiment, the surface comprises at least one recess, the surface being treated in order to be converted into carbide or nitride, then polished in order to localize this conversion to said recess.

In a fifth embodiment, the surface comprises at least one protruding portion, the surface being treated in order to be converted into carbide or nitride, then polished in order to exclude this conversion from said protruding portion.

In a sixth embodiment, the surface is converted into carbide or nitride uniformly, then machined locally in order to localize the conversion to the non-machined portions.

The present invention also relates to a wearable object comprising a such the external element.

In a first embodiment, said wearable object is a timepiece comprising a case formed by a middle, equipped with a bezel, closed by a back and a glass, said wearable object furthermore comprising controlling means, and a strap with its clasp fastened to the middle via two pairs of horns, and in that the external element is chosen to be arranged in the list comprising the middle, the bezel, the controlling means, the back, the strap or the clasp.

In another embodiment, said wearable object furthermore comprises an electronic module that is able to use said treated surface so as to have at least one conversion with a non-zero electrical conductivity in order to provide at least one function.

In another embodiment, the surface treated so as to have at least one conversion with a non-zero electrical conductivity will be an antenna in order to provide a communication function.

In another embodiment, the surface treated so as to have at least one conversion with a non-zero electrical conductivity will be an electrode in order to provide a control function.

In another embodiment, the surface treated so as to have at least one conversion with a non-zero electrical conductivity will be a partition used in a shielding function allowing an electronic component or module to be isolated from interference from another electronic component or module.

In another embodiment, the surface treated so as to have a least one conversion with a non-zero electrical conductivity will be at least one conductive track allowing an electronic component or module to be electrically connected to at least one other electronic component or module.

The present invention furthermore relates to a process for treating an external element for a wearable object made from a first material, the first material being an insulating ceramic, said process comprising the following steps:

Providing the external element and placing it in a hermetically sealed chamber containing an atmosphere that is atomically heavy with a chemical element;

Locally heating, by way of a first focused heat source, such as a laser for example, the surface of the external element so that atoms of the atmosphere of the chamber combine locally with the surface of the first material in the location where said surface is heated.

In a first embodiment, the atmosphere is created by dissociating a gas via the same heat source that locally heats the surface of the external element.

In a second embodiment, the atmosphere is created by dissociating a gas via a second heat source that is independent of the source that locally heats the surface of the external element.

In a third embodiment, the atmosphere is created by dissociating a gas via a second heat source that is independent of the first heat source that locally heats the surface of the external element, the external element being heated uniformly via a third heat source to a temperature that is lower than that allowing the combination of the atoms of the atmosphere with the first material, the first heat source serving to locally raise the temperature of the surface of the external element in order to allow the combination of the atoms of the atmosphere with the first material.

In a first variant, said process comprises the following steps
 Providing the external element;
 Locally depositing on the surface of said external element a metal layer that will act as a mask in order to limit the carburization or nitridation of the zirconia to the zones of the surface of the external element that are not protected by the metal deposition;
 Placing said external element in a hermetically sealed chamber containing an atmosphere that it is atomically heavy with a chemical element and heating the surface of the external element so that atoms of the compound of the atmosphere of the chamber combine with the surface of the first material that is not covered by the metal deposit;
 Selectively and chemically attacking the surface of said external element in order to remove the metal deposit in order to confine the conductive zones to the zones not covered by the metal deposit in the carburization/nitridation step.

In a first embodiment, the selective metal deposit is produced by deposition through a mask placed beforehand on the external element.

In a second embodiment, the selective metal deposit is produced by deposition followed by a step of structuring the surface of said external element by laser.

In a third embodiment, the selective metal deposit is produced by deposition followed by a step of photolithography on the surface of said external element.

In a fourth embodiment, the step consisting in depositing a selective metal layer consists in depositing a masking layer over the entirety of the surface of said external element then in selectively etching this masking layer to a desired form then in depositing the metal layer over the entirety of the surface of said external element, the remaining masking layer then being removed by chemical attack.

In a second variant, said process comprises the following steps:
 Providing the external element;
 Treating said external element by placing it in a hermetically sealed chamber containing an atmosphere that is atomically heavy with a chemical element and heating its surface so that atoms of the atmosphere of the chamber combine with the surface of the first material;
characterized in that said process furthermore comprises, prior or subsequent to the step consisting in treating said external element, a step of structuring the external element allowing a relief be created on its surface.

In a first embodiment, when the step of structuring the external element is carried out subsequent to the step consisting in treating the surface of said external element, the structuring removes the surface layer from the structured zones and localizes it to the non-structured zones.

In a second embodiment, the process furthermore comprises, when the step of structuring the external element is carried out prior to the step consisting in treating the surface of said external element, a polishing step in order to remove the surface layer from the top part of the surface in relief of the external element and thus to localize the conductive zones to recesses not touched by the polishing.

BRIEF DESCRIPTION OF THE FIGURES

The aims, advantages and features of the invention will become more clearly apparent from the following detailed description of at least one embodiment of the invention, which is given merely by way of non-limiting example and illustrated by the appended drawings, in which:

FIGS. 6 to 20 schematically show a second embodiment of the process according to the invention; and FIGS. 21 and 22 schematically show a third embodiment of the process according to the invention.

DETAILED DESCRIPTION

Figure 1:
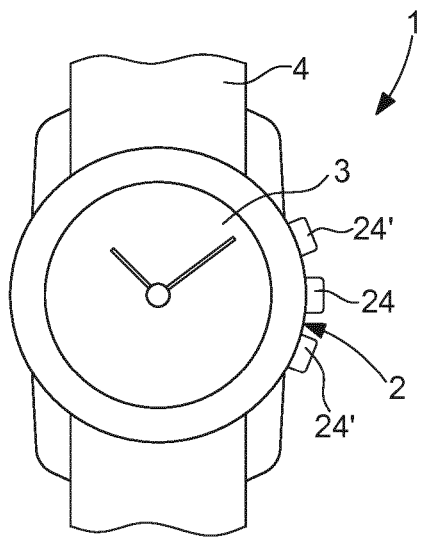
FIGS. 1 and 2 schematically show the wearable object according to the invention.
Figure 2:
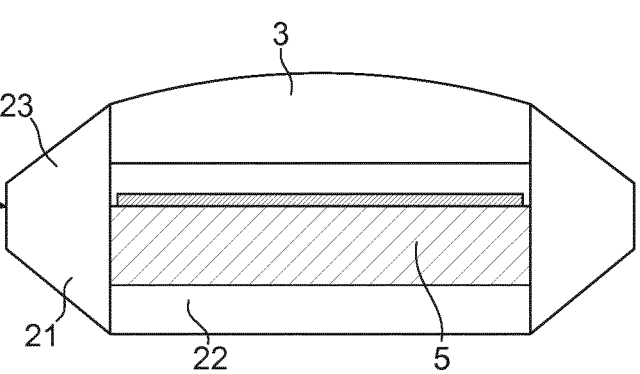

FIGS. 1 and 2 illustrate a wearable object 1 according to the invention. An example wearable object according to the invention is a timepiece. Such a timepiece comprises a case 2 formed by a middle 21 closed by a back 22 and a glass 3. This case 2 encloses an electronic module that may be an electromechanical or electronic watch movement 5. This electronic module may be associated with another element such as a mechanical movement. This wearable object may also comprise a strap 4 comprising two strap halves 4' or a plurality of links. An external element according to the invention is therefore included in the list comprising the middle, the bezel, the back, the strap, the clasp, the folding buckle or the pin buckle necessary to close the strap. Of course, the watch may also comprise a bezel 23, which is optionally rotatable and optionally integrated into the middle, and controlling means such as a crown head 24 or pushbuttons 24'. The middle 21 will possibly be equipped with an integrated or added bezel.

The external element according to the invention is made from a first material. This material is chosen to be of ceramic type. The ceramic used here is zirconium oxide $ZrO_2$, which is also called zirconia.

Advantageously, according to the invention, the surface of this ceramic external element 10 is treated. This surface treatment is carried out so as to be selective, i.e. the entirety of the surface of the external element 10 is not necessarily treated. This surface treatment is used in order to obtain a change in electrical conductivity in specific zones.

Figure 3:
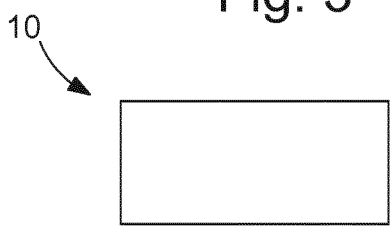
FIGS. 3 to 5 schematically show a first embodiment of the process according to the invention.
Figure 4:
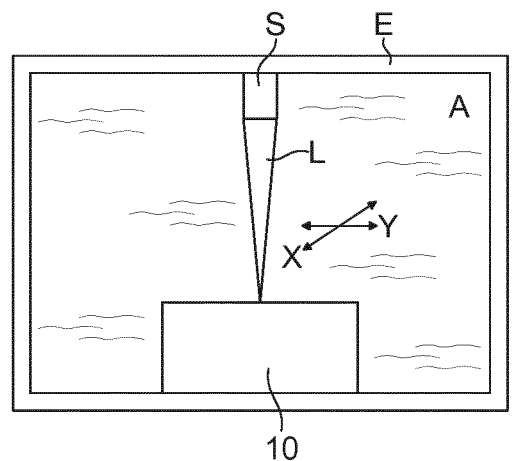
Figure 5:
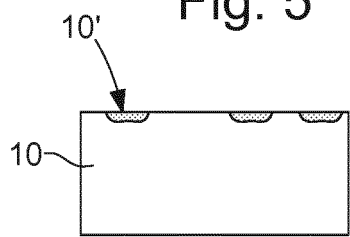
Figure 6:
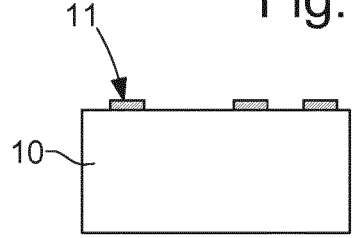

In a first embodiment, which is shown in FIGS. 3 to 5, the treatment according to the present invention consists in a selective carburization/nitridation of the external element 10 with a focused heat source such as a laser. It will be recalled that a carburization/nitridation consists in activating the part to be carburized/nitrided by heating it in an atmosphere heavy with atoms of carbon or nitrogen.

The first step therefore consists in providing the external element 10 to be treated and in placing it in a chamber E. This chamber E is hermetically sealed and contains an atmosphere A that is heavy with atoms of carbon C or of nitrogen N depending on whether a carburization or nitridation is being carried out. This atmosphere A heavy with atoms of carbon C or of nitrogen N may be created by dissociating compounds such as methane $CH_4$, dinitrogen $N_2$ or ammonia $NH_3$. This dissociation is carried out by heating the raw components in order to break their molecular bonds and to obtain atomic atmospheres.

The second step consists in selectively carburizing or nitriding the external element 10 by activating it by heating the surface of the part in chosen zones 10'. In order to be able to selectively heat said surface in the chosen zones 10', a focused heat source S, e.g. a laser delivering a laser beam L, is used. This laser beam is preferably pulsed. The surface of the external element 10 is then heated locally in the zones 10' to a temperature of between 700 and 1100° C. for a time of 30 to 180 minutes. Under the effect of this temperature, the atoms of carbon or nitrogen of the atmosphere A of the chamber E combine with the zirconia surface in the zones 10' of the external element 10. It is a question of a conversion of the surface of the zones 10' of the external element 10, over a small thickness of about 10 to 500 nm, into zirconium carbide or zirconium nitride having a metallic aspect of platinum color or of a color close to that of yellow gold, respectively, and a non-zero conductivity. It is therefore a question of superficially modifying the structure of the zirconia to obtain a new crystal structure corresponding to that of zirconium carbide/zirconium nitride and not of adding a coating that is liable to be torn off or to detach from the surface of the article, in particular when the latter is subjected to severe wear conditions. More particularly, the surface layer that has the zirconium-carbide or zirconium-nitride structure extends from the surface to a depth of between 10 and 500 nm.

In point of fact, zirconium carbide and zirconium nitride have a non-zero electrical conductivity in contrast to zirconia, which is considered to be an insulator. Thus, the zones that are carburized or nitrided have a non-zero electrical conductivity. As the rest of the external element is not converted, conductive zones encircled by insulating zones result.

To carry out the various steps, a plurality of methods of execution may be employed.

In a first method of execution, the dissociation of the gas to obtain an atmosphere that is heavy with atoms of carbon C or of nitrogen N and the local activation of the surface of said external element use the same laser.

In a second method of execution, the dissociation of the gases to obtain an atmosphere that is heavy with atoms of carbon C or of nitrogen N is carried out with a first heat source whereas the local activation of the surface of said external element 10 uses the laser.

In a third method of execution, the dissociation of the gases to obtain an atmosphere that is heavy with atoms of carbon C or of nitrogen N is carried out with a first heat source, and the external element 10 is heated via a second heat source whereas the local activation of the surface of the external element uses the laser. This third method of execution allows the external element 10 to be preheated uniformly and a smaller temperature difference to be obtained in the zone of the surface of the external element 10 treated by the focused heat source.

One advantage of this first embodiment is that it easily allows the surface of the external element 10 to be activated selectively. Specifically, a laser beam has the advantage of having an adjustable beam diameter.

In a second embodiment, which is shown in FIGS. 6 to 20, the process uses a selective metallization as mask to obtain a selective carburization or nitridation of the surface of the external element 10.

The first step therefore consists in providing the external element 10 and in depositing a metallization 11 on its surface. This metallization is selective, i.e. it is carried out on the one or more zones that it is desired to carburize or to nitride. This metal deposit is for example made from a material comprised in the list including chromium, tantalum, molybdenum, tungsten, niobium, titanium and silicon and is produced using one of a number of methods of execution.

In a first method of execution, which is shown in FIGS. 7 and 8, the metallization is produced by masking the surface of the external element 10 via a mask 12, then depositing a metal via a physical-vapor-deposition (PVD) process. Thus, only those zones Z that are not covered by the mask receive the metal deposit 11.

In a second method of execution, which is shown in FIGS. 9 to 12, the metallization is produced by depositing a masking layer 13, such as a layer of Kapton or a layer of ink or of lacquer or of resin, on the surface of the external element. This layer 13 is then selectively etched depending on the desired esthetic appearance, causing apertures 13' to appear. The whole lot is then covered with a metal layer 11 by PVD deposition, the layer being deposited both on the masking layer 13 and in the recesses formed in said mask. Lastly, the masking layer 13 is removed by chemical etching, leaving the metal layer 11 only in the zones Z corresponding to the locations of the recesses 13' of the removed mask.

In a third method of execution, which is shown in FIGS. 13 to 15, the selective metal deposition consists in depositing a metal 11 over the entire surface of the external element 10 in order then to use a focused heat source S such as a laser to structure the deposited metal layer 11. This structuring consists in etching the surface of the external element 10 in order to remove the metal layer 11 in undesired locations and to leave the metal layer 11 in the desired zones Z.

Figure 16:
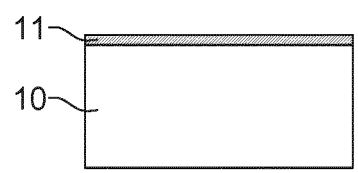
Figure 17:
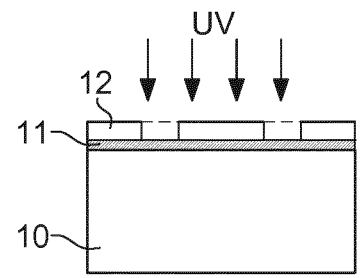
Figure 18:
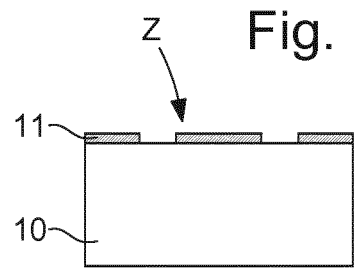

In a fourth method of execution, which is shown in FIGS. 16 to 18, the selective metal deposition consists in depositing the metal over the entire surface of the external element 10. Subsequently, a photolithography step is used with a mask 12 to locally modify the deposited metal layer 11. This local modification is followed by a chemical etching step in order to remove the metal layer 11 in the undesired locations and to leave it in the desired zones Z.

Figure 19:
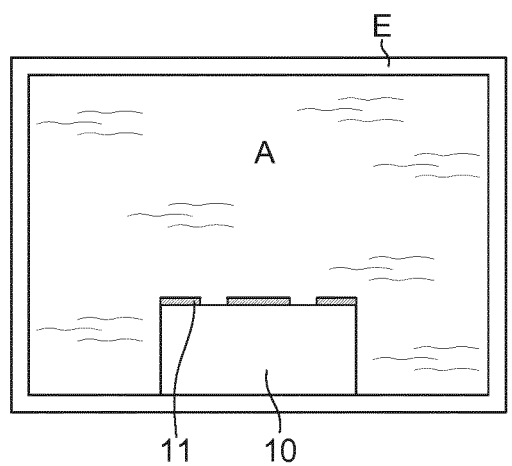
Figure 20:
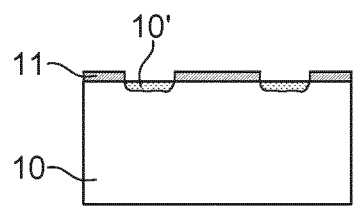

Once this metal deposition has been carried out, the following step consists in carburizing or nitriding the external element 10 with the metal layer 11 in the zones Z of its surface. To do this, the external element 10 is placed in a chamber E that contains an atmosphere A that is heavy with atoms of carbon C or of nitrogen N, as indicated in FIG. 19. The whole lot is then heated using a plasma technique such as described in patent EP 0 850 900. However, the metal deposit 11 here plays the role of a shield preventing the carburization/nitridation of the zones covered with this metal deposit 11 and allowing the non-covered zones 10' to be converted, as shown in FIG. 20.

In a following step, the metal deposit 11 is chemically dissolved in order to let the zirconia appear in its original color. Therefore, an external element having an exposed zone and a carburized/nitrided, and therefore conductive, zone is obtained.

In a third embodiment, the selective conversion of the surface of the external element into a conductive zone uses the principle of carburization/nitridation and structuring.

In a first method of execution, which is shown in FIG. 21, the first step consists in providing the zirconia external element 10. This first step also consists in structuring this external element 10. This structuring may be carried out in two different ways: during the manufacture of the external element 10 or subsequent to this manufacture.

In the case where the structuring is carried out during the manufacture of the external element, it will be understood that this manufacture consists in mixing together powders in order, subsequently, to place them in a mold and to sinter them, i.e. to subject them to a temperature and a pressure such that a conversion occurs. Thus, the mold in which the powders are placed may have a shape that includes the desired reliefs and structures.

In the case where the structuring is carried out subsequent to the manufacture of the external element, laser or mechanical machining is envisionable.

In a second step, the external element is carburized or nitrided. To do this, the structured external element 10 is placed in a chamber E in which there is an atmosphere A that is heavy with atoms of carbon or nitrogen. The whole lot is then heated via a plasma for a set time in order to convert the surface of the external element 10 into conductive zirconium carbide or conductive zirconium nitride, respectively. This carburization/nitridation is therefore carried out over the entirety of the surface of the external element.

In a third step, the external element undergoes a polishing step. This polishing step consists in removing the surface layer of the external element 10. However, the external element 10 is equipped with structures 17 that take the form of recesses 17b or protruding portions 17a, these recesses 17b or protruding portions 17a themselves being carburized/nitrided. Therefore, the polishing does not concern the whole of the surface of the external element 10. Specifically, in the case where the structures 17 are recesses, the polishing operation leaves the carbonization/nitridation, i.e. the conductive portions, in the recesses. In the case where the structures 17 are protruding portions, the polishing operation removes the carbonization/nitridation from these protruding portions.

Thus, a relief is obtained the recesses of which are selectively conductive.

In a second method of execution, which is shown in FIG. 22, the first step consists in providing the zirconia external element.

In a second step, said external element is carburized/nitrided. To do this, the structured external element 10 is placed in a chamber in which there is an atmosphere that is heavy with atoms of carbon or nitrogen. The whole lot is then heated via a plasma for a set time in order to convert the surface of the external element into conductive zirconium carbide or conductive zirconium nitride, respectively. This carburization/nitridation is therefore carried out over the entirely of the surface of the external element.

In a third step, the external element 10 undergoes a structuring step. This step consists in removing material from the external element. To do this, laser or mechanical machining is used. The removal of material may be carried out so as to locally remove only the surface layer of 10 to 500 nm thickness that has been converted into carbide or nitride. However, the removal of material may be carried out so as to accentuate the relief in the conductive zones.

This conversion of the surface of the external element to achieve zones having an electrical conductivity allows electrical tracks to be produced in order to electrically connect an electronic component or module to at least one other electronic component or module, integrated antennas to be produced, and electrodes for touch controls or buttons to be produced. These zones having a non-zero electrical conductivity will be used by the electronic module of the wearable object. These zones having a non-zero electrical conductivity also allow a shielding function, i.e. a function allowing one electronic component or module to be isolated from interference from another electronic component or module, to be provided.

It will be understood that various modifications and/or improvements and/or combinations that will be obvious to those skilled in the art may be added to the various embodiments of the invention described above without departing from the scope of the invention such as defined in the appended claims.

Thus, it will be understood that the external element may be treated in various locations on its surface.

The invention claimed is:

1. An external element for a wearable object,
   the external element being made from a first material, the first material being an insulating ceramic,
   wherein a peripheral surface of the external element is treated locally so that the surface includes an insulating zone and a conductive zone, the conductive zone including at least one conversion with a non-zero electrical conductivity,
   wherein the surface includes at least one protruding portion protruding above a top surface of the external element,
   wherein an entirety of the peripheral surface is configured to be treated to be converted into carbide or nitride, and
   wherein of the entirety of the peripheral surface of the external element, only a top surface of the protruding portion does not include the carbide or nitride.

2. The external element as claimed in claim 1, wherein the first material is zirconia.

3. The external element as claimed in claim 1, wherein the peripheral surface is selectively treated to be converted into carbide.

4. The external element as claimed in claim 1, wherein the peripheral surface is selectively treated to be converted into nitride.

5. The external element as claimed in in claim 1, wherein the peripheral surface comprises at least one recess, the peripheral surface being treated to be converted into carbide or nitride and polished to localize the conversion to the recess.

6. A wearable object comprising the external element as claimed in claim 1.

7. The wearable object as claimed in claim 6, wherein the wearable object is a timepiece comprising a case formed by a middle, including a bezel, closed by a back and a glass, the wearable object further comprising controlling means, and a strap fastened to the case middle via two pairs of horns, and wherein the external element is arranged in one of the case middle, the bezel, the controlling means, the back, the strap, or a clasp.

8. The wearable object as claimed in claim 7, wherein the wearable object further comprises an electronic module configured to use the peripheral surface treated to include the at least one conversion with a non-zero electrical conductivity to provide at least one function.

9. The wearable object as claimed in claim 6, wherein the peripheral surface treated to include the at least one conversion with a non-zero electrical conductivity is an antenna to provide a communication function.

10. The wearable object as claimed in claim 6, wherein the peripheral surface treated to include the at least one conversion with a non-zero electrical conductivity is an electrode to provide a control function.

11. The wearable object as claimed in claim 6, wherein the peripheral surface treated to include the at least one conversion with a non-zero electrical conductivity is a partition used in a shielding function allowing an electronic component or module to be isolated from interference from another electronic component or module.

12. The wearable object as claimed in claim 6, wherein the peripheral surface treated to include the at least one conversion with a non-zero electrical conductivity is at least one conductive track allowing an electronic component or module to be electrically connected to at least one other electronic component or module.

* * * * *